United States Patent [19]

Kawada et al.

[11] Patent Number: 4,809,599
[45] Date of Patent: Mar. 7, 1989

[54] IMAGE FORMING APPARATUS WITH MICROCAPSULE PRESSURE RUPTURE

[75] Inventors: Ken Kawada; Minoru Ishikawa, both of Kanagawa, Japan

[73] Assignee: Fuji Photo Film Co., Ltd., Kanagawa, Japan

[21] Appl. No.: 68,089

[22] Filed: Jun. 30, 1987

[30] Foreign Application Priority Data

Jul. 2, 1986 [JP] Japan ................. 61-155789

[51] Int. Cl.$^4$ ............................................. B30B 3/04
[52] U.S. Cl. ................... 100/176; 29/121.8; 29/132; 226/193; 118/116
[58] Field of Search ............ 100/176, 155 R; 29/132, 29/121.1, 121.8; 226/193; 355/9, 3 FU, 27; 118/116; 430/98

[56] References Cited

U.S. PATENT DOCUMENTS

| | | | |
|---|---|---|---|
| 2,569,546 | 10/1951 | Treue | 29/121.18 |
| 3,389,466 | 6/1968 | Parris | 29/121.2 X |
| 4,200,389 | 4/1980 | Matsui et al. | 100/176 X |
| 4,258,095 | 3/1981 | Larson et al. | 118/116 X |
| 4,441,417 | 4/1984 | Katayama et al. | 100/176 |
| 4,448,516 | 5/1984 | Arney et al. | 355/27 |

Primary Examiner—Andrew M. Falik
Attorney, Agent, or Firm—Sughrue, Mion, Zinn, Macpeak and Seas

[57] ABSTRACT

A pressure image forming apparatus in which a sheet S of photo-sensitive and pressure-sensitive material is exposed to an original image, a sheet C of image fixing material is overlaid on the sheet S, and the image on the sheet S is transferred by a pair of pressure rolls 304, 312. One of the rolls is a hard roll having a multiplicity of small projections on its surface which rupture microcapsules on the sheet S to effect the image transfer to sheet C.

10 Claims, 2 Drawing Sheets

IMAGE FORMING APPARATUS WITH MICROCAPSULE PRESSURE RUPTURE

BACKGROUND OF THE INVENTION

This invention relates to a pressure image forming apparatus in which an image obtained by exposing to an original image is transfered under pressure.

An example of an image recording medium in which microcapsules containing a photosensitive composition are utilized is disclosed in Japanese Kokai No. 179,836/1982. This system has a substrate which carries capsules made of a synthetic polymeric resin and containing a vinyl compound, a photopolymerization initiator and a coloring precursor.

In an image recording method using this system, microcapsules are hardened by being exposed, and parts of the microcapsules which have not been hardened are ruptured by pressure to release the coloring agent precursor, thereby forming a color image. This method ensures that an image of a high quality can be obtained by a dry-type simple process, but this system suffers from a disadvantage in that the photosensitivity is much smaller as compared with a system which makes use of silver halide.

The present applicant has proposed, in the specification of Japanese Patent Application No. 117,089/1985, a novel recording medium which has a high photosensitivity and which makes it possible to obtain an image of a high quality by a simple dry-type process. This recording medium applies at least a photosensitive silver halide, reducing agent, polymerizable compound and a color image forming substance over a substrate, and at least the polymerizable compound and the color image forming substance consist of a photosensitive composition confined in common microcapsules.

An image recording method which makes use of the latter type of photo- and pressure-sensitive medium is disclosed in the specification of Japanese Patent Application No. 121,284/1985 filed by the same applicant. According to this method, the heat-developable medium is first exposed so that a latent image is formed thereon in conformity with the image to be recorded. This medium is thereafter heated for development so that the polymerizable compound in the area where the latent image exists is polymerized to produce a polymeric compound, thereby thermally setting the microcapsules. Then, the medium is superposed on an image receiving medium having an image receiving layer capable of receiving the color image forming substance, and is pressed to the image receiving medium so that at least part of the microcapsules having no latent image is ruptured so as to transfer the color image forming substance to the image receiving medium, thereby forming an image on the image receiving medium. In order to obtain a clear image when the image on the photo- and pressure-sensitive medium is fixed under pressure to the image receiving layer, it is necessary to uniformly press the photo- and pressure-sensitive medium to the image receiving medium under given conditions, ex. 30–60 kg./cm. and a substrate thickness of 60–120 μm.

A pair of conventional sheet pressing rolls may comprise a hard plastic roll, a rubber roll, or a metal roll having a smooth surface, and a metal roll which faces the former and has the same smooth surface. In the case of pressing rolls having such smooth surfaces, a large degree of pressure on these surfaces is needed to break the microcapsules. To obtain a large pressure on the surfaces, an extremely large pressing force is needed. This results in the occurrence of creases, an increased weight of the apparatus, and difficulty in the formation of a pressure-transferred image of high definition.

SUMMARY OF THE INVENTION

Accordingly, an object of the present invention is to provide a compact and simple pressure image forming apparatus in which an image obtained by exposing a photo-sensitive and pressure-sensitive medium to an original image is positively transferred to an image receiving layer to form a clear image.

According to the invention, the above and other objects can be accomplished by forming an image on a sheet of photo-sensitive and pressure-sensitive material, applying a sheet of image fixing material, and passing the superposed sheets between a pair of pressure rolls, wherein one of the rolls is a hard roll having a multiplicity of small projections on its surface.

Preferably, the hard roll is made of rubber or metal, and the projections have a smoothly curved cross-sectional configuration.

The extremity of each projection may be acute, and the projections may be formed by embedding an infinite number of extremely thin wires in the surface of the roll, with the diameter of each wire ranging from 0.5 to 0.05 mm.

The height of each projection ranges from 5 microns to 5 mm, and the pitch of the extremities of the projections ranges from 5 to 500 microns.

The photo-sensitive and pressure-sensitive medium used in accordance with the present invention may be of a type which is disclosed in the above-mentioned Japanese Patent Application No. 121,284/1985 and in which a color image forming substance is transferred to an image receiving medium having an image receiving layer so as to form an image on the image receiving medium. It may also be of a type which is disclosed in commonly assigned Japanese Kokai No. 209,444/1987 and in which a color image is formed on a photo- and pressure-sensitive medium itself without forming any image receiving medium, or a type of recording medium which is disclosed in the above-mentioned Japanese Kokai No. 179,836/1982 and in which microcapsules containing a photosensitive composition are utilized.

The above and other objects and features of the present invention will become apparent from the following descriptions of a preferred embodiment taking reference to the accompanying drawings.

DETAILED DESCRIPTION OF THE PREFERRED EMBODIMENTS

Figure 1:
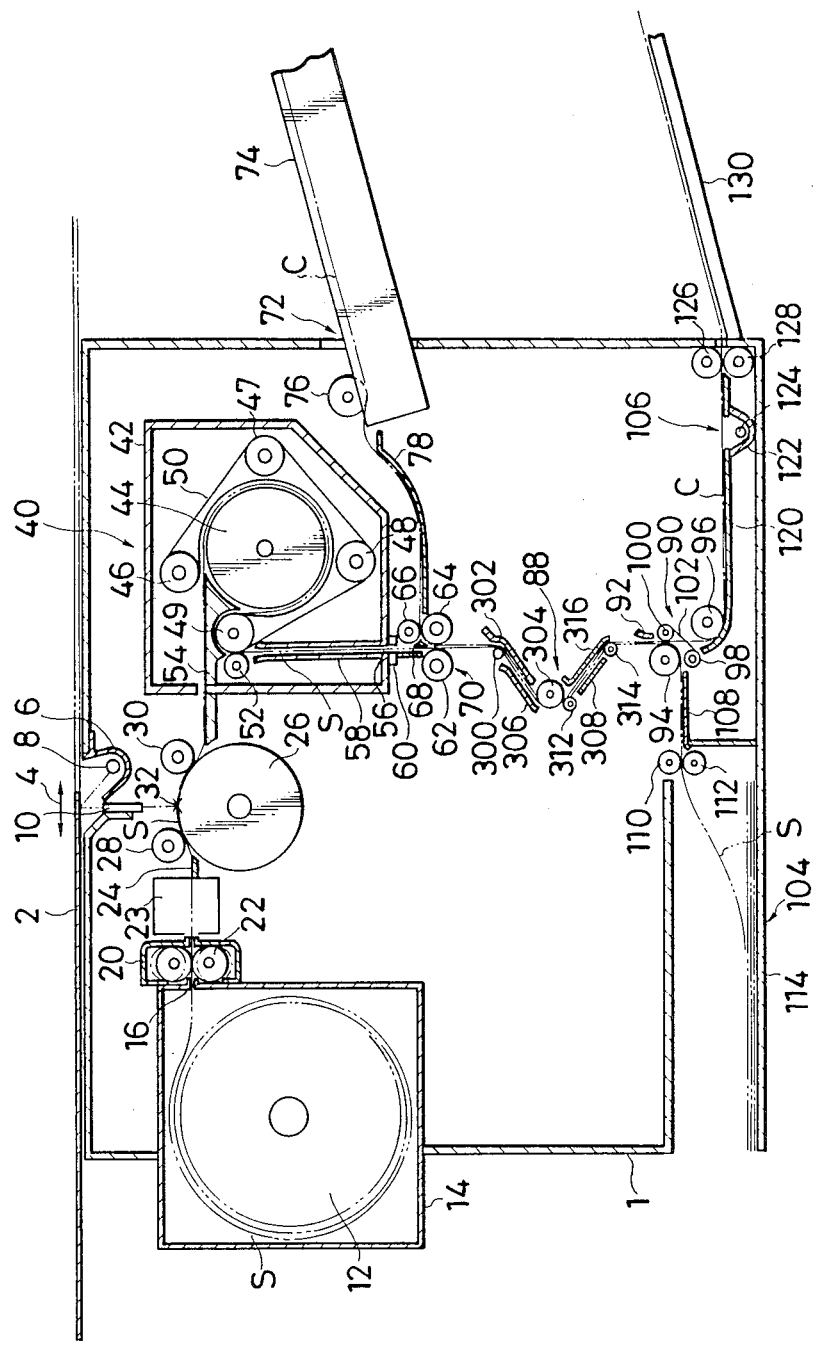
FIG. 1 is a sectional view of an image recording apparatus in which a pressure image forming apparatus which represents an embodiment of the present invention is incorporated.

An image recording apparatus in which a pressure image forming apparatus which represents an embodiment of the present invention is incorporated will be described below with reference to the accompanying drawings. The image recording apparatus embodying the present invention makes use of a type of photo-sensitive and pressure-sensitive heat-developable medium in which an image is formed on an image receiving medium and fixed by heat-development. As shown in FIG. 1, in section, an original support glass plate 2 is mounted on the upper surface of a housing 1 such as to be slidable in a reciprocating manner in the direction indicated by arrows 4.

That is, the glass plate 2 with an original placed on it and facing downward slides between positions as indicated by the solid line and the chain double-dashed line in FIG. 1.

Under the glass plate 2 are disposed a lighting lamp 8 with a mirror 6 for illuminating the original, and a fiber lens array 10 for forming an image of the original on a photosensitive, pressure sensitive medium (hereinafter referred to as "sensitive medium") S in a predetermined position.

A sensitive medium cartridge which accommodates a sensitive medium roll 12 around which the sensitive medium S is wound, is detachably attached to a side portion of the housing 1. A pair of sensitive medium supply rolls 22 accommodated in a magazine connection dark box 20 are disposed at an outlet 16 of the cartridge 14 for the sensitive medium S. A desired length of sensitive medium S which has been wound around the roll 12 is thereby let out at a desired time. The supply rolls 22 move apart from each other as indicated by the chain lines to facilitate the advancement of the sensitive medium S when the leading end thereof has been engaged by downstream feed means. A cutter unit 23 for cutting the sensitive medium S and a guide plate 24 are disposed forward of the dark box 20 (hereinafter, "forward" means "downstream" relative to the direction of advancement of the sensitive medium S, etc.).

An exposed sensitive medium support roll 26 and two sensitive medium nip rolls 28 and 30 in contact with the support roll 26 under pressure are disposed forward relative to the guide plate 24. The sensitive medium S which is guided by the guide plate 24 is brought close to the exposed support roll 26 by the nip rolls 28 and 30, and the fiber lens array 10 effects exposure of this medium to an image of the original in a positive 32 between the nip rolls.

A heat development device 40 for effecting development by heating the sensitive medium S after exposure is disposed forward relative to the exposed sensitive medium supporting roll 26. The heat development device 40 is provided with a housing 42 having a heat insulation property, an endless belt 50 which is disposed in the housing 42 and is wound around a circular arc on the outer periphery of a heating roll 44 through about 270° while being supported by the heating roll 44 heated to about 120° C. and four belt support rolls 46, 47, 48, and 49, and a nip roll 52 in contact with the support roll 49 under pressure.

The heat development device 40 is further provided with a guide device 54 which guides the sensitive medium S supplied from the support roll 26 onto the heating roll 44 and which detaches the sensitive medium S from the heating roll 44, and a vertical guide device 58 for guiding the sensitive medium S transported by the support roll 49 and the nip roll 52 to an outlet 56. A sensitive medium end detecting sensor 60 is disposed at the outlet 56.

Immediately below the outlet 56 are disposed a pair of press-contact rolls 62 and 64, a nip roll 66 in contact with the press-contact roll 64, and a superposing device 70 for superposing the sensitive medium and image receiving paper one on the other constituted by a guide member 68 for guiding the sensitive medium S to the contacting portions of the press-contact rolls 62 and 64.

An image receiving paper supplying device 72 is disposed at the side of the superposing device 70. The image receiving paper supplying device 72 is constituted by an image receiving paper supply cassette 74 detachably attached such as to project from the housing 1, an image receiving paper feed roll 76 for feeding out image receiving paper C from the inside of the cassette 74, and a guide plate 78 for guiding the image receiving paper C fed by the feed roll 76 to the contacting portions of the press-contact roll 64 and the nip roll 66. The image receiving paper C has a width smaller than that of the sensitive medium S by about 6 mm and is superposed by the superposing device 70 in such a manner that the center of the image receiving paper C in the widthwise direction corresponds to that of the sensitive medium S.

Figure 2:
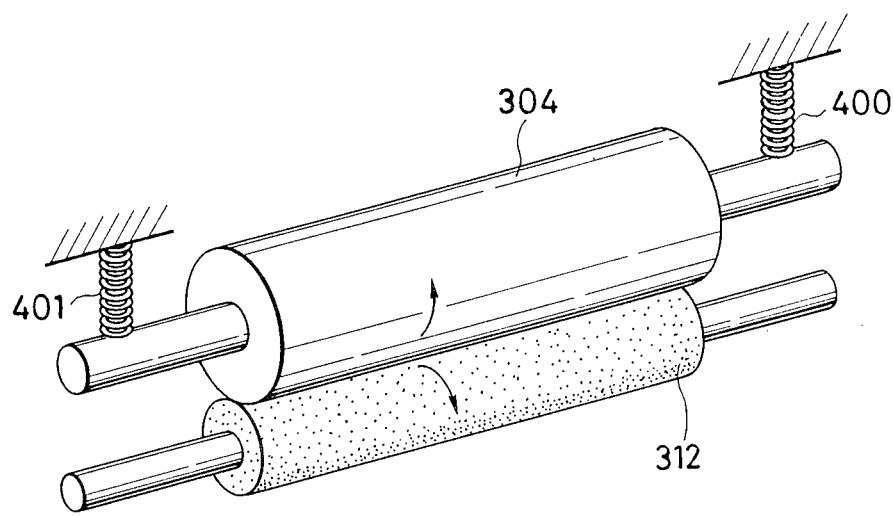
FIG. 2 is a schematic perspective view of the pressure image forming apparatus which is the embodiment of the present invention.
Figure 3:
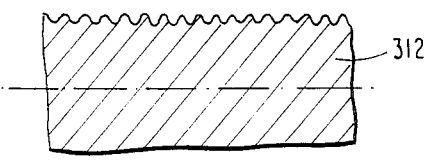
FIG. 3 is a partial sectional view of a pressure roller having smoothly curved surface irregularities.
Figure 4:
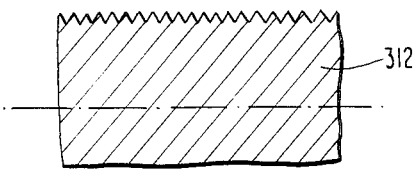
FIG. 4 is a partial sectional view of a pressure roller having sharp surface irregularities.
Figure 5:
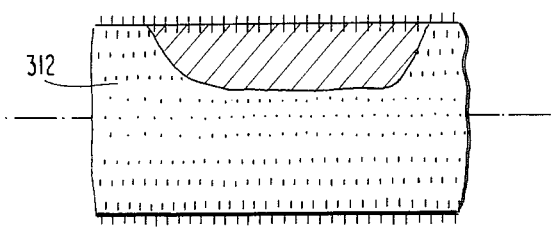
FIG. 5 is a partial sectional view of a pressure roller wherein surface irregularities are formed by embedded wires.

A pressure image forming device 88 which effects transfer by pressing the sensitive medium S and the image receiving paper C which have been superposed (hereinafter called a sheet W) is disposed under the superposed device 70. As shown in FIGS. 1 and 2, the pressure image forming device 88 has a transport roll 300, a guide plate 302 for changing the direction of transportation of the sheet W, a smooth pressure roll 304, two guide plates 306 and 308 adapted for this roll, a roughened pressure roll 312 for pressing the sheet W against the pressure roll 304 in a convexance rip therebetween, and a transport roll 314 and a guide plate 316 which change the direction of transportation of the sheet W supplied from the roughened presure roll 312 which cooperates with the smooth pressure roll 304 to pinch the sheet W. A pressing roll is axially supported by a U-shaped bearing member of the housing 1 (not shown in FIG. 2). The pressure roll 304 having a smooth surface may be made of a hard rubber or a metal to evade deformation. The roughened pressure roll 312 is a hard roll having an infinite number of small irregularities formed on its surface and may preferably be made of a metal, a ceramic or a hard plastic rubber. The shape of each irregularity is selected from smooth curved shapes as shown in FIG. 3 or sharpened shapes as shown in FIG. 4, that is, shapes in which the top of a raised portion is acute. A sharpened shape makes it possible to break microcapsules by a pressing force smaller than that applies by a roller having a smooth shape, but it tends to cause wear at the top of the raised portion. Such irregularities may also be formed by embedding an infinite number of thin wires in the surface of the roll as shown in FIG. 5 or by rolling with a matrix reverse to the irregularities. Otherwise, they may be formed by electric machining with a reverse matrix for the irregularities. If a wire is embedded in the surface, the diameter of the wire is preferably within a range of 0.5 to 0.05 mm. The height or distance between the apexes of the raised portion and the bottom portion of each irregularity may range from several microns to several hundred microns in consideration of the range within which the irregularities can be worked and formed and of a possibility of loading occurring when the irregularities are extremely fine, i.e. when the irregularities are too small and too many in number, the roller surface approximates that of a smooth roller. The distance may preferably be within a range of 5 to 500 microns. The pitch or distance between the apexes of adjacent raised portions may be, for the same reasons, within a range of several microns to several hundreds microns, or preferably 5 to 500 microns.

In the pressure image forming apparatus in accordance with the present invention, small raised portions press capsules so that the capsules are locally pressurized and broken by a smaller pressing force. A conventional apparatus having only smooth rolls necessitates the application of a large pressing force, since the smooth rolls act as if two boards pinch and squeeze a balloon. In the case of the roughened roll in accordance with the present invention, it is sufficient to apply a small pressing force, since the roughened roll acts as needles puncturing a plurality of balloons.

A separating device 90 for separating the sensitive medium and the image receiving paper from each other is disposed under the pressure image forming device 88. The separating device 90 is constituted by a guide member 92, a first feed roll 94, a second feed roll 96, and a separation belt 102 which is wound around guide rolls 98 and 100 so as to be pressed only to the outer edge of the sensitive medium S at each end of the first feed roll 94.

A photosensitive material disposed section 104 is disposed at one side of the separation device 90, while a fixing device 106 is disposed on the other side of the same. The disposal section 104 is constituted by a guide member 108, a pair of feed rolls 110 and 112, and a waste box 114, and is adapted to send the sensitive medium S from the separation device 90 into the waste box 114.

The fixing device 106 is constituted by a guide member 120, an ultraviolet illuminating lamp 124 with a reflector 122, and pair of feed rolls 126 and 128. The fixing device 106 is adapted to irradiate the image receiving paper C transported from the separating device 90 and guided by the guide member 120 with ultraviolet ray for 5 seconds, thereby fixing the image.

A delivery tray 130 for receiving the image receiving paper C after the fixing is mounted forward relative to the fixing device 106 so as to project from the housing 1.

The image recording apparatus of this embodiment is further provided with a controller (not shown) to which are operatively connected the lighting lamp 8, cutter unit 23, original supporting glass plate 2, sensor 60 for sensing the leading end of the photosensitive medium, and the superposing device 70. The controller is adapted to control a series of operations which will be described below. The sensitive medium S is set in such a manner that its leading end is positioned in the vicinity of the cutting portion of the cutter unit 23 or within the magazine connection dark box 20 when the apparatus is in a preparatory stage of its operation, that is, a so-called copy preparation stage.

When the copy start button (not shown) is pressed, the supply rolls 22 operate to supply the sensitive medium S and the lighting lamp 8 lights up to illuminate the original immediately before the leading end of the photosensitive material reaches position 32. When the leading end of the sensitive medium S reaches position 32, the original supporting glass plate 2 is moved and the sensitive medium S is fed in synchronism therewith, so that the image on the original is projected onto the sensitive medium, thereby exposing the sensitive medium. After the sensitive medium S has been supplied a distance equal to the length of the original in the moving direction, the cutter device 23 operates to cut the sensitive medium S.

The sensitive medium S thus exposed and then cut is supplied to the heat development device 40 where it is pressed by the endless belt 50 onto the heating roll 44 and is heated at about 120° C., thereby effecting development. The sensor 60 detects when the leading end of the sensitive medium S, after development, has reached the outlet 56.

Meanwhile, the image receiving paper supply device 72 starts to operate in response to the pressing of the start button or, in synchronism with the start of exposure, so as to supply the image receiving paper C until the leading end of the image receiving paper C is brought into the nip between the pressing roll 64 and the nip roll 66.

The superposing device 70 then operates to superpose the image receiving paper C and the sensitive medium S in such a manner that the image receiving paper C having a smaller width is centered in the widthwise direction relative to the sensitive medium S having a larger width while the leading end of the image receiving paper C is aligned with that of the sensitive medium S in the widthwise direction or several millimeters ahead thereof. The device 70 then transports the superposed sheet members to the pressure image forming device 88 where both sheet members are pressed in each other at a predetermined pressure of, e.g., 200 kg/cm$^2$, so that the image is transferred to the image receiving paper C.

After the transfer of the image, the sensitive medium S is separated from the image receiving paper C by the separating belt 102 in the separating device 90 and is forwarded to the disposal section 104. Meanwhile, the image receiving paper C is transported to the fixing device 106 where it is irradiated with ultraviolet rays for 5 seconds, thereby fixing the image. The image receiving paper C is then sent to the delivery tray 130 by the feed rolls 126 and 128.

The lighting lamp 8 with reflecting mirror in accordance with this embodiment may be of any type capable of emitting radiation rays including visible rays. For instance, a strobe lamp, a flash lamp, a tungsten lamp, a mercury lamp, a halogen lamp such as an iodine lamp, a xenon lamp, a laser light source, a CRT light source, a plasma light source, a fluorescent lamp or a light-emitting diode can be used as the lighting source. It is also possible to use a combination of a micro-shutter array making use of LCD (Liquid Crystal), PLZT (plumbum zirconium titanate doped with lanthanum) or the like and a linear light source or a planar light source.

In the described embodiment, the exposure of the sensitive medium S is effected by directly projecting the original image on the medium S through the fiber lens array 10, but a spherical lens may be used in place of the fiber lens array 10. It is also possible to expose the sensitive medium S indirectly through an image electric signal, by making use of a CRT, FOT (Fiber Optic Tube), LCA (Liquid Crystal Array), electro-optical element array, a combination of a laser, modulator and a scanner or a combination of an LED and a scanner. In such a case, it is possible to effect on the image signal various processings for gradation correction, color correction and magnification and editing of the projected image.

In the described embodiment, the scanning of the original image is conducted by moving both the original and the photosensitive medium, while stationing the optical system. It is also possible to effect the scanning by moving either one of the original and the photosensitive medium and the optical system.

In the heat development device 40, the heating coil 44 is used for heating. However, the heat development device may otherwise be constituted such as to effect heating in the manner of a belt heating, a thermal head having an array of heat-generating elements, electric heating, or irradiation of microwave or infrared rays. It is possible to heat a type of sensitive medium S by utilizing eddy currents which are generated by electromagnetic induction. It is also possible to use a heating bath of a liquid which is inactive to the sensitive medium S, e.g., a fluoro-liquid, as the means for heating. In these cases, the heating temperature generally ranges from 80° to 200° C., preferably 100° to 160° C.

In the above-described embodiment also, the image receiving paper is superposed to the sensitive medium S after the development process to effect pressure transfer, but the present invention is also effective when applied to an image recording apparatus in which the development is effected on the sensitive medium S after the image receiving paper C has been superposed on the development medium S, thereafter effecting pressure transfer.

The present invention has been described with respect to an image recording apparatus in which a photo- and pressure-sensitive medium is capable of transferring an image, in a pressing manner, to an image receiving layer formed on an image receiving paper. If a type of photo-sensitive and pressure-sensitive medium having an image receiving layer is used, it is possible to remove the image receiving paper supply device and the sensitive medium disposal tray from the image recording apparatus. If the photo-sensitive and pressure-sensitive medium disclosed in the above-mentioned Japanese Patent Laid-Open No. 179,836/1982 is used, the heat development device is omitted.

The invention has thus been shown and described with reference to a specific embodiment, however, it should be noted that the invention is in no way limited to the details of the illustrated arrangements but changes and modifications may be made without departing from the scope of the appended claims.

We claim:

1. An image forming apparatus, comprising:
   (a) means for exposing a side of a first sheet of image recording material (S) coated with microcapsules containing a photosensitive composition to an original image,
   (b) means for developing the exposed sheet,
   (c) means for superposing a second sheet (C) of image receiving material on the side of the exposed and developed first sheet coated with microcapsules,
   (d) means for rupturing the microcapsules to transfer the recorded image to the second sheet, and
   (e) means for fixing the transferred image on the second sheet,
   (f) wherein the rupturing means comprises a pair of cylindrical rollers (304, 312) having parallel axes, biased against each other at a predetermined pressure, and defining a conveyance nip through which the superposed sheets are passed, one of the rollers having a hard surface defining a multiplicity of minute, closely spaced, upstanding projections for rupturing the microcapsules.

2. An image forming apparatus according to claim 1, wherein said one roller is disposed to engage a side of the first sheet opposite the side coated with microcapsules.

3. An image forming apparatus according to claim 2, wherein another one of said rollers is made of rubber.

4. An image forming apparatus according to claim 2, wherein another one of said rollers is made of metal.

5. An image forming apparatus according to claim 2, wherein each of said projections has a smoothly curved cross-sectional configuration.

6. An image forming apparatus according to claim 2, wherein an extremity of each of said projections is acute.

7. An image forming apparatus according to claim 2, wherein said projections comprise an infinite number of extremely thin wires embedded in the surface of said one roller.

8. An image forming apparatus according to claim 7, wherein the diameter of each of said wires ranges from 0.5 to 0.05mm.

9. An image forming apparatus according to claim 2, wherein the height of each of said projections ranges from 5 microns to 5 mm.

10. An image forming apparatus according to claim 2, wherein the pitch of the extremities of said projections ranges from 5 to 500 microns.

* * * * *